(12) United States Patent
Shen et al.

(10) Patent No.: US 12,342,550 B2
(45) Date of Patent: Jun. 24, 2025

(54) MEMORY ARRAY STRUCTURE

(71) Applicant: SHANGHAI IC R&D CENTER CO., LTD, Shanghai (CN)

(72) Inventors: Ling Shen, Shanghai (CN); Yu Jiang, Shanghai (CN); Huijie Yan, Shanghai (CN); Zhifang Li, Shanghai (CN); Linmei Dong, Shanghai (CN); Jiebin Duan, Shanghai (CN); Jianxin Wen, Shanghai (CN)

(73) Assignees: SHANGHAI INTEGRATED CIRCUIT EQUIPMENT & MATERIALS INDUSTRY INNOVATION CENTER CO., LTD, Shanghai (CN); SHANGHAI IC R&D CENTER CO., LTD, Shanghai (CN)

( * ) Notice: Subject to any disclaimer, the term of this patent is extended or adjusted under 35 U.S.C. 154(b) by 607 days.

(21) Appl. No.: 17/784,652

(22) PCT Filed: Jul. 23, 2020

(86) PCT No.: PCT/CN2020/103763
§ 371 (c)(1),
(2) Date: Jun. 12, 2022

(87) PCT Pub. No.: WO2021/135180
PCT Pub. Date: Jul. 8, 2021

(65) Prior Publication Data
US 2023/0005990 A1    Jan. 5, 2023

(30) Foreign Application Priority Data
Dec. 30, 2019 (CN) .......................... 201911388598.5

(51) Int. Cl.
| | | |
|---|---|---|
| H10B 63/00 | (2023.01) | |
| G06F 7/57 | (2006.01) | |
| G06N 3/063 | (2023.01) | |

(52) U.S. Cl.
CPC ............... *H10B 63/80* (2023.02); *G06F 7/57* (2013.01); *G06N 3/063* (2013.01); *H10B 63/30* (2023.02)

(58) Field of Classification Search
CPC ........ H10B 63/80; H10B 63/30; G11C 16/04; G11C 13/00
See application file for complete search history.

(56) References Cited

U.S. PATENT DOCUMENTS

2023/0005990 A1*   1/2023   Shen .................. G06N 3/063

* cited by examiner

*Primary Examiner* — Mark V Prenty
(74) *Attorney, Agent, or Firm* — Bayramoglu Law Offices LLC

(57) ABSTRACT

The present invention disclosures a memory array structure, comprising an array composed of multiple memory devices arranged in rows and columns, each of the rows is set with a row leading-out wire, and each of the columns is set with a column leading-out wire, memory devices are correspondingly positioned at intersection points of each row leading-out wire and each column leading-out wire; wherein, the first terminal of each of the memory devices is individually connected to the row leading-out wire of the same row, and the second terminal of each of the memory devices is connected to a first terminal of a switch in the same column, the second terminal of the switch is connected to the column leading-out wire of the same column; wherein, each of the rows is set with one to multiple the switches, and the first terminal of each of the switches is connected to one to all of the second terminals of the memory devices in the same column. The advantage of the present invention is that the corresponding analog currents output of input signals of (Continued)

different specified rows according to multiply-accumulate operation requirements of each of the columns can be obtained simultaneously, thus multiply-accumulate operations of different input signals of different scales can be performed, which greatly improves operation speed and using efficiency of the array.

12 Claims, 3 Drawing Sheets

MEMORY ARRAY STRUCTURE

CROSS-REFERENCE TO RELATED APPLICATION

This application claims priority of International Patent Application Serial No. PCT/CN2020/103763, filed Jul. 23, 2020, which is related to and claims priority of Chinese Patent Application Serial No. CN201911388598.5, filed Dec. 30, 2019. The entirety of each of the above-mentioned patent applications is hereby incorporated herein by reference and made a part of this specification.

TECHNICAL FIELD

The disclosure relates to the technical field of integrated circuit design, in particular to a memory array structure applied to in-memory operations.

BACKGROUND

Development of artificial intelligence (AI) proposes new demands on traditional arithmetic processing systems, a main problem is that an artificial intelligence network has a large number of calculations and a lot of data, and a demand for calculations is relatively concentrated. Most of the calculations are mainly Multiply Accumulate (MAC).

The traditional arithmetic processing system is a universal system, which is not special satisfied the computing requirements of the artificial intelligence. In addition, since the traditional arithmetic processing system adopts a non-Neumann structure, an arithmetic region and a storage region are separate, thus a bottleneck problem of data transmission exists.

One commonly proposed solution is combining storage and operations and running parts of operations directly on a storage side. The method mainly uses a resistance characteristic of a memory to realize simulation of memory (internal memory) operation.

Please refer to FIG. 1. FIG. 1 is a schematic diagram of an existing storage structure, which shows a basic topology structure of a storage-computing neural network without a control terminal. As shown in FIG. 1, the storage structure adopts a crossbar architecture. A memory array is composed of multiple rows and multiple columns, each of the rows and the columns has a separate leading-out wire, a storage device 10 is correspondingly set at the intersection of a row leading-out wire r and a column leading-out wire c. Wherein, a positive electrode of each of memory devices 10 is connected to the row leading-out wire of the same row, and a negative electrode is connected to the column leading-out wire of the same column. A disadvantage of the structure is that it cannot effectively solve a problem of sneak path, which causes great waste of power consumption.

As shown in FIG. 2, a switch 11 is added to each intersection of the crossbar of FIG. 1, thus the positive electrode of each of the memory devices 10 is connected to the row leading-out wire of the same row, and the negative electrode passes is connected to the column leading-out wire of the same column by the switch 11, although it can solve the leakage problem, it will increase the area of the entire matrix.

In addition, the above two structures have a problem that an entire matrix or a storage operation unit in the same row needs to be opened during an operation, which not only causes the loss of the power consumption, but also limits the application scenario of the entire operation storage matrix.

Therefore, there is a need to propose a memory matrix architecture that not only saves area and the power consumption, but also can be flexible controlled.

SUMMARY

The purpose of the present invention is to overcome the above-mentioned defects in the prior art and provide a memory array structure.

In order to achieve the above objective, the present invention adopts following technical solution: a memory array structure, comprising an array composed of multiple memory devices arranged in rows and columns, each of the rows is set with a row leading-out wire, and each of the columns is set with a column leading-out wire, the memory devices are correspondingly positioned at intersection points of each row leading-out wire and each column leading-out wire; wherein, the first terminal of each of the memory devices is individually connected to the row leading-out wire of the same row, and the second terminal of each of the memory devices is connected to a first terminal of a switch in the same column, the second terminal of the switch is connected to the row leading-out wire of the same column; wherein, each of the rows is set with one to multiple switches, and the first terminal of each of the switches is connected to one to all of the second terminals of the memory devices in the same column.

Further, each of the switches is set with a control terminal, each of the rows is set with a control leading-out wire, and the control terminals of the switches set in different columns and in the same row are commonly connected to the control leading-out wire of the same row, the control terminals of the switches in the same column are respectively connected to the control leading-out wires of different rows.

Further, the control leading-out wires are set in parallel with the row leading-out wires.

Further, the on-resistance of each of the switches is lower than the parallel resistance of all of the memory devices in the same column which are connected and in a low resistance state, and the off-resistance thereof is higher than the resistance of any one of the memory devices in the same column which are connected and in a high resistance state.

Further, the memory devices are non-volatile memory devices.

Further, the memory devices are resistive random access memory devices, the first terminals of the memory devices are the positive electrodes of the resistive random access memory devices, and the second terminals of the memory devices are the negative electrodes of the resistive random access memory devices.

Further, the positive electrodes of the resistive random access memory devices are the top electrodes of the resistive random access memory devices, and the negative electrodes of the resistive random access memory devices are the bottom electrodes of the resistive random access memory devices.

Further, the switches are NMOS devices, the first terminals or the second terminals of the switches are source terminals or drain terminals of the NMOS devices, and the control terminals of the switches are the gate terminals of the NMOS devices.

Further, the row leading-out wires are not turned on simultaneously.

Further, the control leading-out wires of the rows are not turned on simultaneously.

The advantage of the present invention is that the corresponding analog currents output of input signals of different specified rows according to multiply-accumulate operation requirements of each of the columns can be obtained simultaneously, thus multiply-accumulate operations of different input signals of different scales can be performed, which greatly improves operation speed and using efficiency of the array.

DETAILED DESCRIPTION

Figure 1:
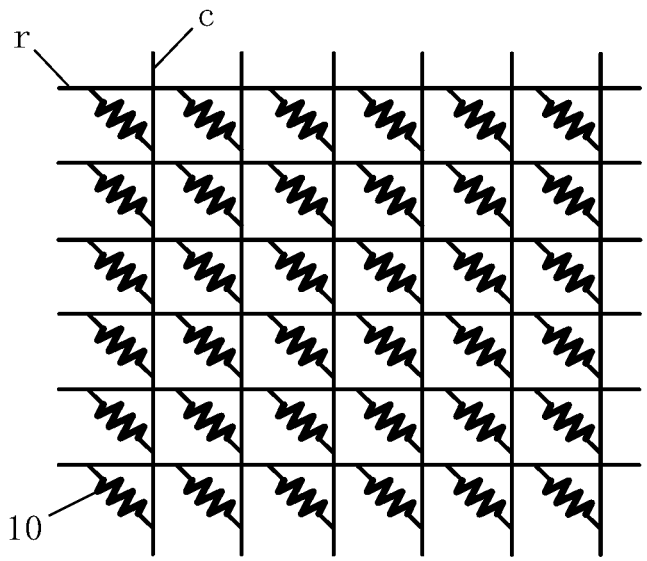
FIG. 1 is a schematic diagram of a basic topology architecture of an existing memory neural network without a control terminal.

In order to make the objectives, technical solutions and advantages of the present invention clearer, the specific embodiments of the present invention will be further described in detail below in conjunction with the accompanying drawings.

It should be noted that in the following specific embodiments, in detailing the embodiments of the present invention, in order to clearly show the structure of the present invention for ease of explanation, the structure in the drawings is not drawn in accordance with the general scale, and carried out in order to partially enlarge, deform and simplify the process, it should be avoided as a limitation of the present invention.

Figure 3:
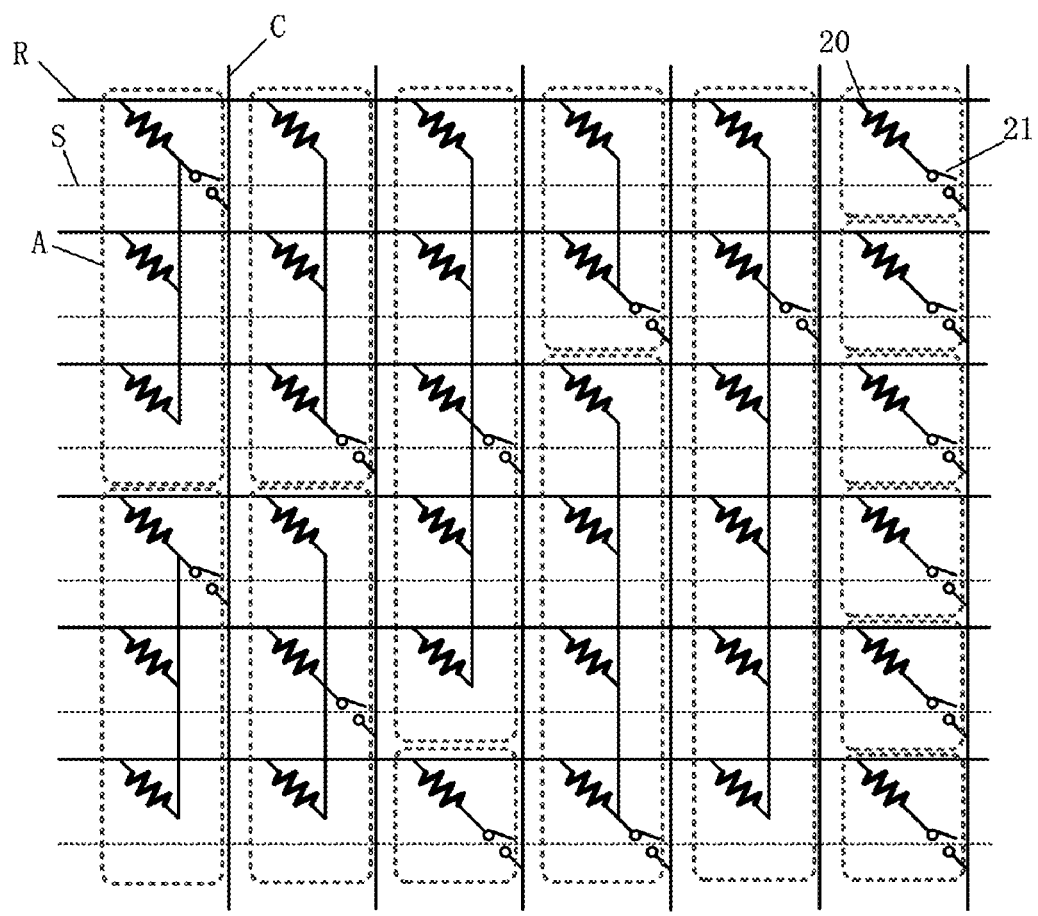
FIG. 3 is a topology schematic diagram of a computer-in-memory neural network of a memory array structure according to a preferred embodiment 1 of the present invention.

In following specific embodiments of the present invention, please refer to FIG. 3, which is a topology schematic diagram of a memory neural network of a memory array structure according to a preferred embodiment 1 of the present invention. As shown in FIG. 3, the present invention provides a novel memory array structure applied to an in-memory operation. The memory array structure is composed of multiple memory devices 20 arranged in rows and columns, for example, a 6×6 array as shown.

Figure 2:
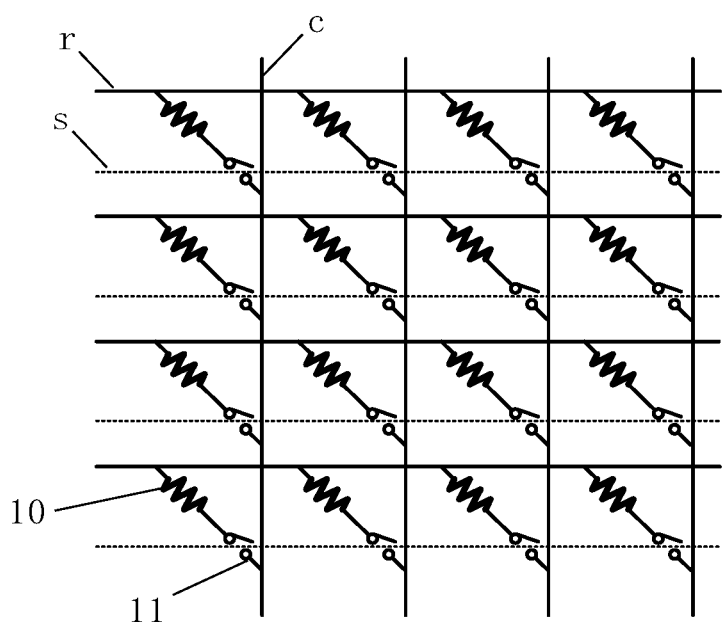
FIG. 2 is a schematic diagram of a basic topology architecture of an existing memory neural network with a control terminal.

The memory array structure of the present invention is a matrix structure, its core feature which is different from the normal matrix structure shown in FIG. 2 is that multiple memory devices 20 set in different rows and in the same column are connected to the same switch 21, and the control leading-out wires of the switches 21 set in the same column are independently of each other and can be shared with the switches 21 set in other columns.

Please refer to FIG. 3. Electrical devices inside the memory array structure mainly comprise memory units (memory devices 20) and the switches 21. each of the rows in the array is set with a row leading-out wire R, each of the columns is set with a column leading-out wire C, and the memory devices 20 are correspondingly set at intersection points of each the row leading-out wire R and each the column leading-out wire C; meanwhile, each of the rows is set with one to multiple the switches 21.

Wherein, the first terminal of each of the memory devices 20 is individually connected to the row leading-out wire of the same row where the memory device 20 is set, and the second terminal of each of the memory devices 20 is connected to the first terminal of the switch 21 in the same column, the second terminal of the switch 21 is connected to the row leading-out wire of the same row where the switch 21 is set.

Each of the rows in the array is set with one to multiple the switches 21, and the first terminal of each of the switches 21 can be connected to the second terminals of one to multiple the memory devices 20 in the same column, or even the second terminals of all of the memory devices 20 in the same column.

Please refer to FIG. 3. Each of the switches 21 can be set with at least one control terminal; each of the rows in the array can be set with a control leading-out wire S. The control terminals of the switches 21 set in different columns and in the same row are commonly connected to the control leading-out wire S in the same row; the control terminals of the switches 21 in the same column are respectively connected to the control leading-out wire S of different rows. That is, each of the control leading-out wires S can be connect to the control terminals of one to multiple switches 21, but at most one switch 21 set in the same column is connected.

Further, the control leading-out wires S can be set in parallel with the row leading-out wires R.

Each of the memory units (memory devices 20) can be a two-terminal or multi-terminal non-volatile memory device, and its main feature is that it exhibits two or more resistance characteristics under the same external electrical signal condition.

If each of the memory units (memory devices 20) is a two-terminal non-volatile memory device, two sets of row and column leading-out wires are related to each of the memory units in an architecture, a first terminal (defined as a positive electrode) of each of the memory devices 20 is directly connected to the row leading-out wire R, and a second terminal (defined as a negative electrode) of each of the memory devices 20 is connected to the column leading-out wire C through the switch 21.

If each of the memory units (memory devices 20) is a multi-terminal non-volatile memory device, then excepting that the two terminals reflect the resistance characteristics are the same as the connection of the two-terminal non-volatile memory device, the other terminals require additional lead control lines to perform a write operation, which are related to resistance change of each of the memory units, but not to an logic operation and connection relationship of an entire architecture, then, the other terminals are not parts of the memory array structure of the present invention and not identified in FIG. 3, which can be understood with reference to the prior art.

Each of the switches 21 has at least one switch control terminal, and two terminals (the first terminal and the second terminal of each of the switches 21) that can be opened or closed. The switch control terminal is used to input an external control signal, so as to turn on or off each of the switches 21.

The on-resistance of each of the switches 21 is lower than the parallel resistance of all of the memory devices 20 in the same column which are connected and in a low resistance state, and the off-resistance thereof is higher than the resistance of any one of the memory devices 20 in the same column which are connected and in a high resistance state.

In the memory array structure of the present invention, the resistance values of the memory units are controlled and written by a reasonable electrical signal. During the in-memory operation, an analog or digital voltage signal is provided to each of the row leading-out wires R, a fixed analog or digital voltage signal is provided to each of the column leading-out wires C, and a digital voltage signal is provided to each of the control leading-out wires S, so as to turn on or off each of the switches 21. Wherein, the row leading-out wires of the rows can be not turned on simultaneously, and the control leading-out wires of the rows can be not turned on simultaneously.

In an operation mode, the analog output current of each of the columns is sum of currents which flow through those memory devices connected to the turned-on switch 21, and each of the currents is defined as the voltage difference between the set-row voltage of the memory device and the set-column voltage thereof divides the resistance thereof. By reasonably controlling the electrical signal at the control terminal of the switch 21, each of the columns can output a multiply-accumulating current value of an input signal received by a specified row, instead of receiving a multiply-accumulate result of an input signal in the same row that is selected and turned on, as in an existing array.

The advantage of the above structure of the present invention is that the corresponding analog currents output of input signals of different specified rows according to multiply-accumulate operation requirements of each of the columns can be obtained simultaneously.

Compared with existing in-memory computing networks, the present invention also has some differences in peripheral controlling, which can be configured according to special application occasions.

Figure 4:
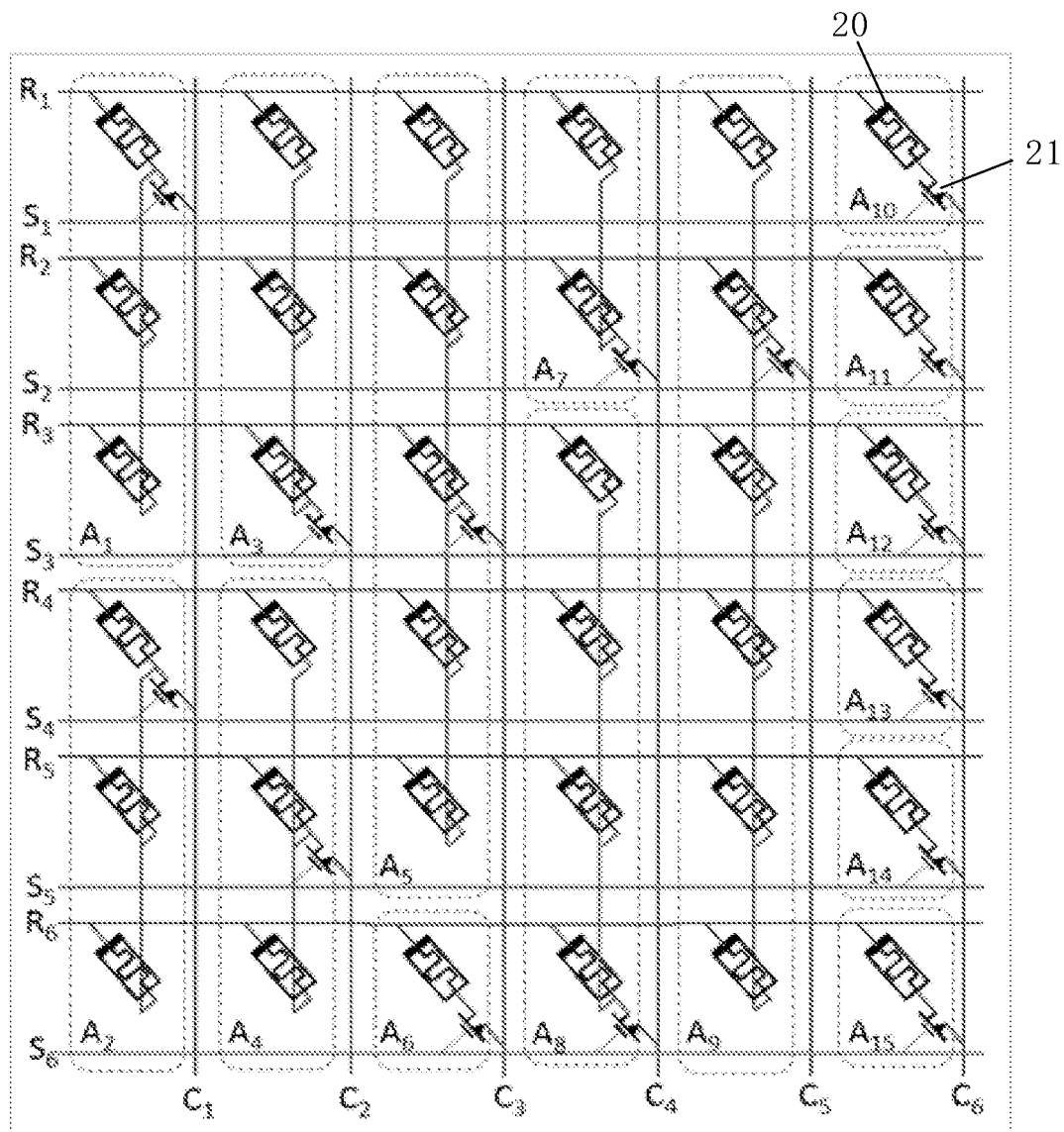
FIG. 4 is a topology schematic diagram of a computer-in-memory neural network of a memory array structure according to a preferred embodiment 2 of the present invention.

Please refer to FIG. 4, which is a topology schematic diagram of a memory neural network of a memory array structure according to a preferred embodiment 2 of the present invention. As shown in FIG. 4, an array architecture on a scale of 6×6 based on a resistive memory unit (RRAM, Resistive Random Access Memory) is introduced exemplarily.

If row leading-out wires R and column leading-out wires C are used as a basis for defining size of an array, the array is composed of 6 rows (row leading-out wires R1 to R6) and 6 columns (column leading-out wires C1 to C6), and 6 control leading-out wires S1 to S6.

In the array, memory devices 20 are RRAM devices, and switches 21 are NMOS devices in a CMOS process. Wherein, each of the RRAM devices 20 is a two-terminal device with a top electrode (positive electrode) and a bottom electrode (negative electrode), which has two resistance states: a high resistance state and a low resistance state. Gate terminal of each of the NMOS devices 21 is connected to the switch leading-out wire S which controls its voltage level to turn on or off the source terminal and the drain terminal. The on-resistance of each of the NMOS devices 21 as a switch is much lower than the low-resistance resistance of each of the RRAM devices 20, and the off-resistance thereof is much higher than the high-resistance resistance of each of the RRAM devices 20.

There are 6 the RRAM devices 20 per row and column. Each of the rows is set with one to multiple the switches. The top electrode of each of the RRAM devices 20 in each of the rows is connected to the row leading-out wire R of the same row, the drain terminal of each of the switches 21 is connected to the bottom electrode of one to multiple the RRAM devices 20 in the same column, and the source terminal of each of the switches 21 is connected to the column leading-out wire C of the same column, and the gate terminal of each of the switches 21 is connected to a certain control leading-out wire S.

In order to specifically illustrate the architecture of the array in FIG. 4, the RRAM units 20 in the same column connected to the same switch 21 are defined together with the switch 21 as an RRAM cluster, which is denoted by a letter A.

As shown in FIG. 4, there are a total of 15 the RRAM clusters A1 to A15. Wherein, there are two the RRAM clusters A1 and A2 in the first column, A1 comprises three the RRAM units 20 with the switch control leading-out wire S1; A2 comprises three the RRAM units 20 with the switch control leading-out wire S4. There are two the RRAM clusters A3 and A4 in the second column, A3 comprises three the RRAM units 20 with the switch control leading-out wire S3; A4 comprises three the RRAM units 20 with the switch control leading-out wire S5. There are two the RRAM clusters A5 and A6 in the third column, A5 comprises five the RRAM units 20 with the switch control leading-out wire S2; A6 comprises one the RRAM unit 20 with the switch control leading-out wire S6. There are two the RRAM clusters A7 and A8 in the fourth column, A7 comprises two the RRAM units 20 with the switch control leading-out wire S2; A8 comprises four the RRAM units 20 with the switch control leading-out wire S6. There is one the RRAM cluster A9 in the fifth column, A9 comprises six the RRAM units 20 with the switch control leading-out wire S2. There are six the RRAM clusters A10 to A15 with the switch control leading-out wires S1 to S6 in the sixth column, and each of the RRAM clusters comprises only one the RRAM unit 20.

In practice, the row leading-out wires R1 to R6 are used as input signal terminals, and the column leading-out wires C1 to C6 are used as output signal terminals. A transmission mode comprises a digital signal transmission or an analog signal transmission, and the multiply-accumulate operation of the two modes are similar. Taking an analog signal as an example, loading an analog voltage on each of the row leading-out wires R1 to R6 and loading the same analog voltage on each of the column leading-out wires C1 to C6, then currents on the column leading-out wires C1 to C6 is sum of currents flowing through each of the RRAM units 20 of the RRAM cluster A, which is equivalent to performing a multiplication operation and an accumulation operation simultaneously.

For example, when only the row leading-out wire R1 is turned on, currents flow through all of the RRAM devices 20 of the RRAM clusters A1 and A10, while the RRAM devices 20 of other clusters are turned off.

Compared with a traditional RRAM array, in the RRAM array of the present invention, a corresponding control leading-out wire is not only capable of controlling one RRAM unit in each of the columns, but can select different rows and different amounts of RRAM units in each of the columns as needed. It has an advantage that when performing a multiply-accumulate operation, items for multiplying in each of the columns can be different. In this way, through inputting reasonable signals and selecting reasonable control terminals, multiply-accumulate operations of different input signals of different scales can be performed, which greatly improves operation speed and using efficiency of the array.

For example, if only the control leading-out wires S2 and S6 are turned on, then a multiply-accumulate operation is not performed on the first column and the second column, the signals of the row leading-out wires R1 to R5 are performed the multiply-accumulate operation on the third column, the signals of all of the row leading-out wires are performed the multiply-accumulate operation on the fourth column and the fifth column, and the signals of the row leading-out wires R2 and R6 are performed the multiply-accumulate operation on the sixth column. Although six inputs are input simultaneously, parts of input signals are performed the multiply-accumulate operation on parts of the columns, which is not possible with the two architectures shown in FIG. 1 and FIG. 2.

The above descriptions are only the preferred embodiments of the present invention, and the described embodiments are not used to limit the scope of patent protection of the present invention. Therefore, any equivalent structural changes made using the contents of the description and drawings of the present invention should be included of the same reasoning. Within the protection scope of the appended claims of the present invention.

What is claimed is:

1. A memory array structure, comprising an array composed of multiple memory devices arranged in rows and columns, each of the rows is set with a row leading-out wire, and each of the columns is set with a column leading-out wire, the memory devices are correspondingly positioned at intersection points of each the row leading-out wire and each the column leading-out wire; wherein, the first terminal of each of the memory devices is individually connected to the row leading-out wire of the same row, and the second terminal of each of the memory devices is connected to a first terminal of a switch in the same column, the second terminal of the switch is connected to the column leading-out wire of the same column; wherein, each of the columns is set with one to multiple the switches, and the first terminal of each of the switches is connected to one to all of the second terminals of the memory devices in the same column.

2. The memory array structure of claim 1, wherein each of the switches is set with a control terminal, each of the rows is set with a control leading-out wire, and the control terminals of the switches set in different columns and in the same row are commonly connected to the control leading-out wire of the same row, the control terminals of the switches in the same column are respectively connected to the control leading-out wires of different rows.

3. The memory array structure of claim 2, wherein the control leading-out wires are set in parallel with the row leading-out wires.

4. The memory array structure of claim 1, wherein the on-resistance of each of the switches is lower than the parallel resistance of all of the memory devices in the same column which are connected and in a low resistance state, and the off-resistance thereof is higher than the resistance of any one of the memory devices in the same column which are connected and in a high resistance state.

5. The memory array structure of claim 1, wherein the memory devices are non-volatile memory devices.

6. The memory array structure of claim 1, wherein the memory devices are resistive random access memory devices, the first terminals of the memory devices are the positive electrodes of the resistive random access memory devices, and the second terminals of the memory devices are the negative electrodes of the resistive random access memory devices.

7. The memory array structure of claim 6, wherein the positive electrodes of the resistive random access memory devices are the top electrodes of the resistive random access memory devices, and the negative electrodes of the resistive random access memory devices are the bottom electrodes of the resistive random access memory devices.

8. The memory array structure of claim 2, wherein the switches are NMOS devices, the first terminals or the second terminals of the switches are source terminals or drain terminals of the NMOS devices, and the control terminals of the switches are the gate terminals of the NMOS devices.

9. The memory array structure of claim 2, wherein the row leading-out wires are not turned on simultaneously.

10. The memory array structure of claim 2, wherein the control leading-out wires of the rows are not turned on simultaneously.

11. The memory array structure of claim 2, wherein the on-resistance of each of the switches is lower than the parallel resistance of all of the memory devices in the same column which are connected and in a low resistance state, and the off-resistance thereof is higher than the resistance of any one of the memory devices in the same column which are connected and in a high resistance state.

12. The memory array structure of claim 9, wherein the control leading-out wires of the rows are not turned on simultaneously.

* * * * *